United States Patent [19]

Shimizu

[11] 3,938,003
[45] Feb. 10, 1976

[54] DUAL TRACE DISPLAY DEVICE
[75] Inventor: Kazuyoshi Shimizu, Yokohama, Japan
[73] Assignee: Leader Denshi Kabushikikaisha, Japan
[22] Filed: June 27, 1973
[21] Appl. No.: 374,018

[30] Foreign Application Priority Data
June 29, 1972 Japan.................. 47-76840

[52] U.S. Cl. ............................. 315/392
[51] Int. Cl.[2] ......................... G01R 13/28
[58] Field of Search ........ 315/18, 26, 25, 27 R, 22, 315/392, 393, 391, 394; 307/251; 324/183

[56] References Cited
UNITED STATES PATENTS
| | | |
|---|---|---|
| 2,848,648 | 8/1958 | Wolcott ............................ 315/26 |
| 3,284,659 | 11/1966 | Outhouse et al.................. 315/24 |
| 3,662,113 | 5/1972 | Von Recklinghausen.......... 307/251 |
| 3,684,903 | 8/1972 | Haraszti......................... 307/251 |

*Primary Examiner*—Maynard R. Wilbur
*Assistant Examiner*—J. M. Potenza
*Attorney, Agent, or Firm*—Hill, Gross, Simpson, Van Santen, Steadman, Chiara & Simpson

[57] ABSTRACT

A dual trace display device having a gate circuit for receiving input signals, a sweep signal generator, a rectangular waveform generator supplied with the output signal from the sweep signal generator, and a driving circuit supplied with the output signal from the rectangular waveform generator and controlling the gate circuit. In this case, a display device is supplied with the output signals from the gate circuit and the sweep signal generator for displaying the same thereon.

5 Claims, 6 Drawing Figures

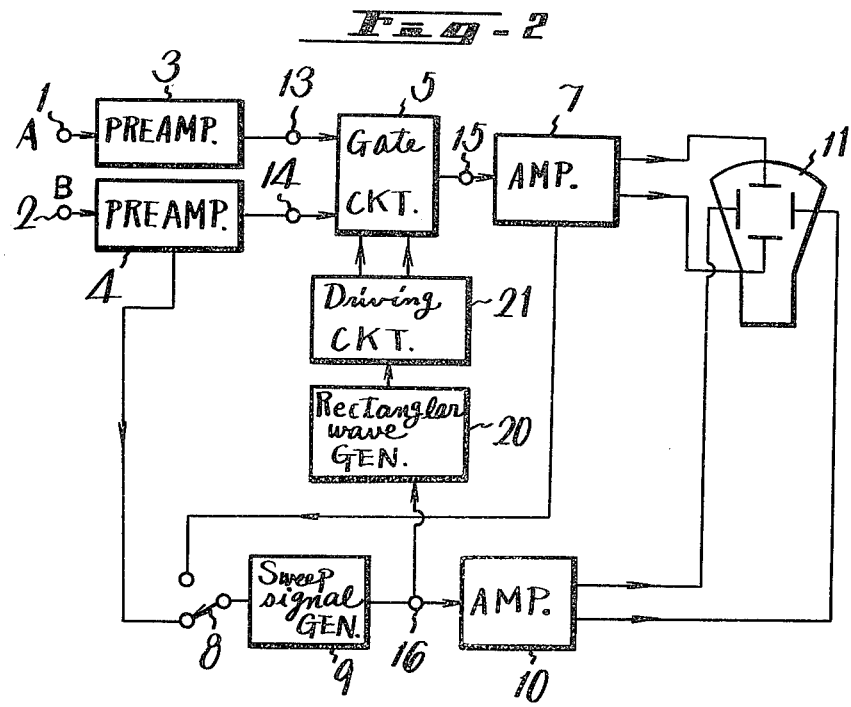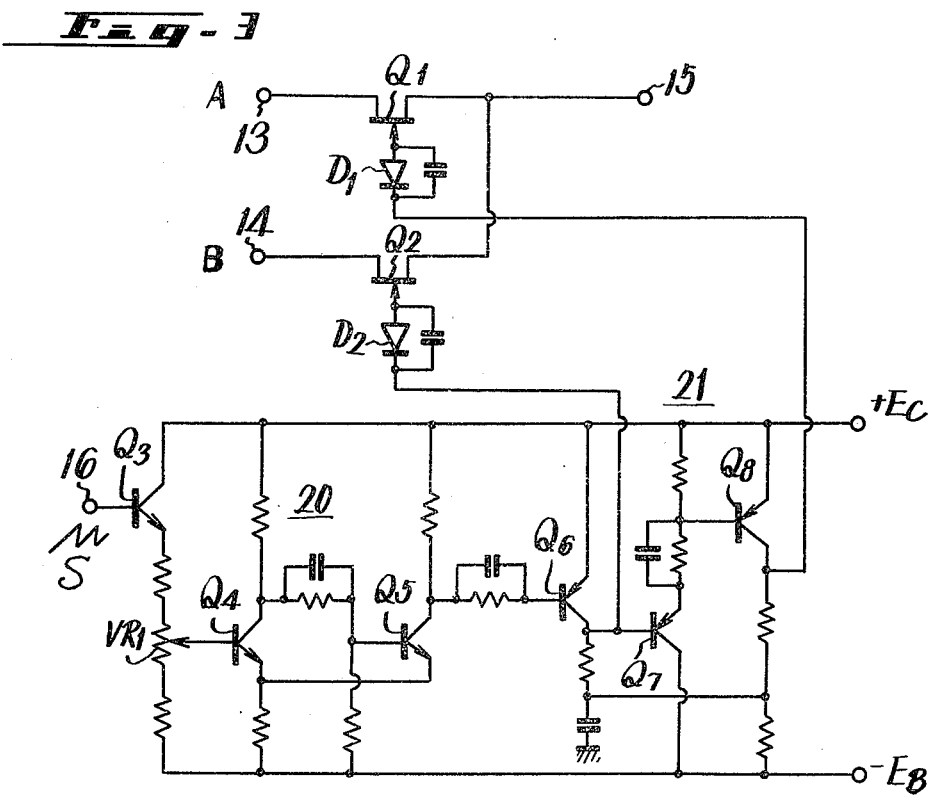

DUAL TRACE DISPLAY DEVICE

BACKGROUND OF THE INVENTION

1. Field of the Invention

The present invention relates generally to a dual trace display device, and more particularly to a dual trace display device in which two input signals are successively displayed on th same scanning axis of the display device changeably.

2. Description of the Prior Art

In a conventional dual trace display device, two input signals A and B are fed to input terminals 1 and 2 and then through pre-amplifiers 3 and 4 to a gate circuit 5, as shown in FIG. 1. The gate circuit 5 is supplied with a switching signal from a rectangular waveform generator 6 to pass therethrough the input signals alternately to an amplifier 7 and the output from the amplifier which is applied to the drive vertical axis of a cathode ray tube 11. A sweep signal generaor 9 is supplied through a switch 8 with the output from the pre-amplifier 4 or the amplifier 7 to produce a horizontal sweep signal in synchronism with the signal applied thereto. The horizontal sweep signal from the sweep signal generator 9 is applied through a amplifier 10 to drive the horizontal axis of the cathode ray tube 11. In this case, in synchronism with the switching of the two input signals, the level of the horizontal axis correspondng to the two input signals is switched to display the input signals A and B on a screen 11a of the cathode ray tube 11 in parallel with each other in vertical direction as shown in FIG. 4. Accordingly, the dual trace display device mentioned as above will be convenient for comparing the phase of the input signals A and B but is not preferred for comparing the amplitude of the input signals A and B.

SUMMARY OF THE INVENTION

It is an object of the present invention to provide an improved dual trace display device.

It is another object of the present invention to provide a dual trace display device in which two input signals are displayed on the same horizontal axis.

It is a further object of the invention to provide a dual trace display device in which on of two input signals is displayed only.

The additional and other objects, features and advantages of the invention will be apparent from the following description taken in conjunction with the accompanying drawings.

BRIEF DESCRIPTION OF THE DRAWINGS

FIG. 2 is a circuit diagram for showing an example of the dual trace display device according to the invention;

FIG. 3 is a connection diagram for showing the main part of the display device shown in FIG. 2;

DESCRIPTION OF THE PREFERRED EMBODIMENT

An embodiment of the present invention will be now described with reference to the drawings.

Figure 1:
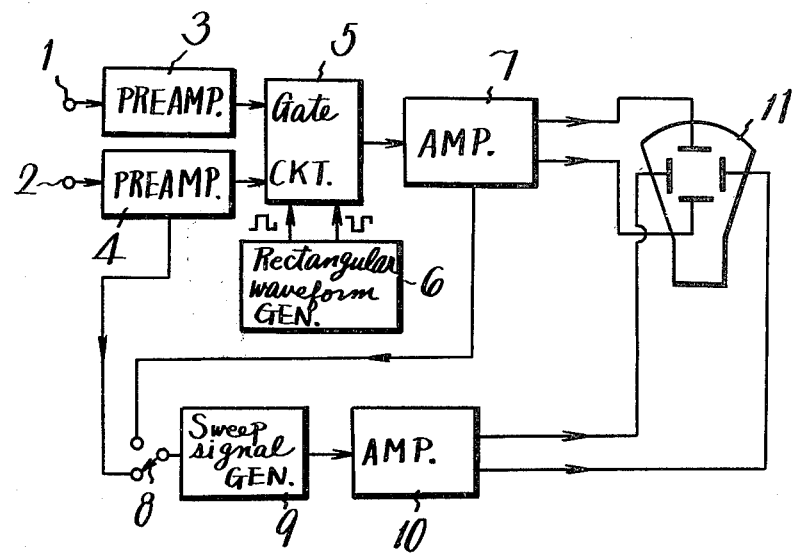
FIG. 1 is a circuit diagram for showing a conventional dual trace display device.
Figure 4:
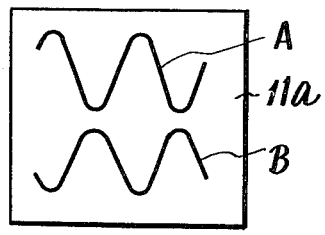
FIG. 4 is a waveform displayed on the screen of the cathode ray tube of the device shown in FIG. 1.

FIG. 2 is a circuit diagram which shows an embodiment of the invention and in which reference numerals similar to those of FIG. 1 designate the similar elements, so that their description will be omitted for the sake of brevity.

In the present invention, a driving circuit 21 for the gate circuit 5 and a rectangular waveform generator 20, which is supplied with the output from the sweep signal generator 9 through a output terminal 16 thereof, are respectively provided. The driving circuit 21 is supplied with the output of the rectangular waveform generator 20 to be controlled.

As shown in FIG. 3, an example of the rectangular waveform generator 20 consists of a Schmitt trigger circuit which is composed of NPN transistors $Q_4$ and $Q_5$. The input level to the Schmitt trigger circuit is set or adjusted by a variable resistor VR1 connected to the emitter circuit of an NPN transistor $Q_3$ the base electrode of which connected to the output terminal 16 of the sweep signal generator 9. The output of the rectangular waveform generator 20 is applied to the base electrode of an PNP-type transistor $Q_6$ which forms together with PNP-type transistors $Q_7$ and $Q_8$ the driving circuit 21. The transistors $Q_6$ and $Q_8$ serve as switching transistors which operate in opposite phases with each other. The collector electrode of the transistor $Q_6$ is connected to the base electrode of the transistor $Q_7$ which is connected as an emitter follower. The output of the transistor $Q_7$ is fed to the base electrode of the transistor $Q_8$.

Figure 6:
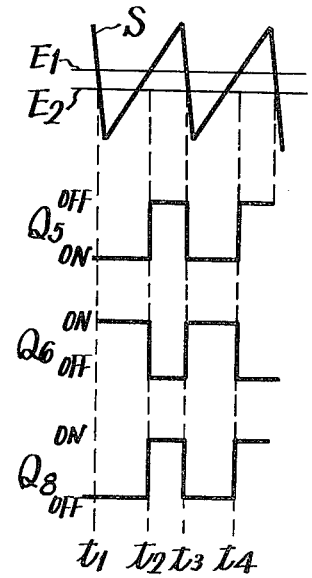
FIG. 6 is a waveform diagram used for explaining the operation of the device according to the invention.

The Schmitt trigger circuit is set in such a manner that when no input signal is applied thereto or the input signal applied thereto is lower than the trigger level thereof, the transistor $Q_4$ is non-conductive but the transistor $Q_5$ is conductive. At this time, the collector electrode of the transistor $Q_5$ has a low voltage and hence the transistor $Q_6$ is made conductive and its collector will have a high voltage. In accordance therewith, the voltage difference between the base-emitter electrodes of the transistor $Q_7$ is reduced to make high the voltage level of the base electrode of the transistor $Q_8$, which is connected to the emitter electrode of the transistor $Q_7$, so that the transistor $Q_8$ is made non-conductive to lower its collector voltage level. This state is kept during the time interval between times $t_1$ and $t_2$ (time interval of $t_1-t_2$) in FIG. 6. However, when the level of the input signal S exceeds a first trigger level E1 of the Schmitt trigger circuit but before it is lower than a second trigger level E2, that is, during the time interval between times $t_2$ and $t_3$ (time interval of $t_2 - t_3$), the above state is reversed to make the transistors $Q_5$ and $Q_6$ nonconductive but the transistor $Q_8$ conductive as shown in FIG. 6. The above states are repeated in accordance with the saw-tooth waveform input signal S. That is, the state during the time interval between times $t_3$ and $t_4$ (time interval of $t_3 - t_4$) is the same as during the time interval of $t_1 - t_2$.

Figure 5:
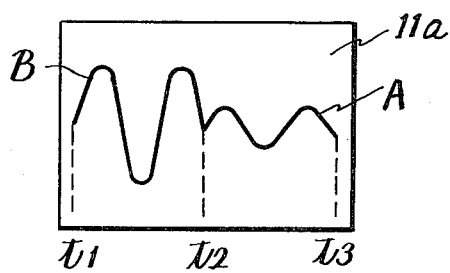
FIG. 5 is a waveform displayed on the screen of the cathode ray tube of the device shown in FIG. 2.

The gate circuit 5 consists of field effect transistors (FETs) $Q_1$ and $Q_2$ which are connected in series to the signal paths for the input signals A and B, respectively, as switching elements. The gate electrodes of the FETs $Q_1$ and $Q_2$ are connected to the collector electrodes of the transistors $Q_8$ and $Q_6$ through diodes $D_1$ and $D_2$, respectively. Thus, when the transistor $Q_6$ is conductive but the transistor $Q_8$ is non-conductive during the time interval of $t_1 - t_2$, the FET $Q_2$ is conductive but the FET $Q_1$ is non-conductive, so that the input signal A passed through the pre-amplifier 3 is not transmitted to an output terminal 15 of gate circuit 5 but the input signal B passed through the pre-amplifier 4 is transmitted to the output terminal 15. That is, during the first half of one sweep period of the sweep signal or the time interval of $t_1 - t_2$, the input signal B is applied through the gate circuit 5 to the vertical axis of the cathode raytube 11, but during the second half of the sweep period or the time interval of $t_2 - t_3$ the input signal A is applied through the gate circuit 5 to the vertical axis of the cathode ray tube 11. Thus, the input signals B and A are sequentially displayed on the screen 11a of the cathode ray tube 11 with the same scanning axis as a reference, as shown in FIG. 5. Accordingly, it will be apparent with the present invention that the amplitudes of the two signals A and B can be easily compared. In this case, it is easy to vary the time intervals of $t_1 - t_2$ and $t_2 - t_3$ or the display rate of the signals A and B by changing the resistance value of the variable resistor VR1.

When the level of the saw-tooth sweep signal S is low and does not arrive at the first trigger level E1, the transistor $Q_6$ is conductive but the transistor $Q_8$ is non-conductive. Therefore only, the input signal B is continuously applied to the vertical axis of the cathode ray tube 11 and is displayed thereon. On the other hand, when the level of the signal S is higher than the trigger level, the transistor $Q_6$ is non-conductive but the transistor $Q_8$ is conductive with the result that only the signal A is displayed. Accordingly, it will be understood that by adjusting the variable resistor VR1 either of the signals A and B can be displayed, that is, the dual trace display device of the present invention can be also used as a single phenomenon display device.

It will be apparent that many modifications and variations may be effected without departing from the spirits and scope of the novel concepts of the present invention.

I claim as my invention:

1. A dual trace display device comprising:
   a. two input terminals supplied with two signals to be displayed, respectively,
   b. a gate circuit connected to receive said two input signals,
   c. a sweep signal generator producing a signal in synchronism with one of said two input signals,
   d. a rectangular waveform generator connected to receive the output from said sweep signal generator and producing an output signal,
   e. a driving circuit connected to receive the output from said rectangular waveform generator, producing a pair of signals with opposite polarities and applying said signals to said gate circuit to alternatively pass said two input signals through said gate circuit, and
   f. a display device connected to receive the outputs from said gate circuit and said sweep signal generator and display thereon said input signals with the same reference axis and simultaneously in a time sequential manner.

2. A dual trace display device according to claim 1, in which said gate circuit consists of two field effect transistors with their gate electrodes controlled by the output from said driving circuit.

3. A dual trace display device according to claim 2, in which a pair of diodes are respectively connected between the gate electrodes of said field effect transistors and the output side of said driving circuit.

4. A dual trace display device according to claim 1, in which said driving circuit further includes a means for changing the DC level of the output signal from said sweep signal generator, whereby only one of said two input signals is passed through said gate circuit to said display device.

5. A dual trace display device according to claim 4, in which said means is a variable resistor.

* * * * *